US012389586B2

United States Patent
Shao et al.

(10) Patent No.: US 12,389,586 B2
(45) Date of Patent: Aug. 12, 2025

(54) SEMICONDUCTOR MEMORY DEVICE AND METHOD FOR MANUFACTURING THE SAME INCLUDING A PLURALITY OF MUTUALLY PERPENDICULAR TRENCHES HAVING THE SAME DEPTH

(71) Applicants: CHANGXIN MEMORY TECHNOLOGIES, INC., Hefei (CN); BEIJING SUPERSTRING ACADEMY OF MEMORY TECHNOLOGY, BeiJing (CN)

(72) Inventors: Guangsu Shao, Hefei (CN); Deyuan Xiao, Hefei (CN); Yunsong Qiu, Hefei (CN); Minmin Wu, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 488 days.

(21) Appl. No.: 17/934,489

(22) Filed: Sep. 22, 2022

(65) Prior Publication Data
US 2023/0200045 A1 Jun. 22, 2023

Related U.S. Application Data

(63) Continuation of application No. PCT/CN2021/129340, filed on Nov. 8, 2021.

(30) Foreign Application Priority Data

Aug. 19, 2021 (CN) .......................... 202110955136.8

(51) Int. Cl.
*H10B 12/00* (2023.01)

(52) U.S. Cl.
CPC ........... *H10B 12/053* (2023.02); *H10B 12/34* (2023.02); *H10B 12/482* (2023.02); *H10B 12/488* (2023.02)

(58) Field of Classification Search
CPC .... H10B 12/053; H10B 12/34; H10B 12/482; H10B 12/488
See application file for complete search history.

(56) References Cited

U.S. PATENT DOCUMENTS

| 7,348,628 B2 | 3/2008 | Yoon |
| 7,781,287 B2 | 8/2010 | Yoon |

(Continued)

FOREIGN PATENT DOCUMENTS

| CN | 1897305 A | 1/2007 |
| CN | 101335241 A | 12/2008 |

(Continued)

OTHER PUBLICATIONS

Supplementary European Search Report in the European application No. 21923590.0, mailed on Aug. 1, 2023. 10 pages.

(Continued)

*Primary Examiner* — Nelson Garces
(74) *Attorney, Agent, or Firm* — Syncoda LLC; Feng Ma

(57) ABSTRACT

A semiconductor device includes a substrate. A method includes the following operations. Multiple first trenches extending in a first direction are formed in the substrate. Multiple second trenches extending in a second direction are formed in the substrate in which the first trenches are formed. The first direction is perpendicular to the second direction. A first depth of a first trench is equal to a second depth of a second trench. A first insulating layer, a conducting layer and a second insulating layer are formed in sequence in the first and second trenches. The conducting layer in the first trench is separated on a cross section in the (Continued)

second direction to form two bit lines connected to sidewalls at either side of the first trench and extending in the first direction. Word lines extending in the second direction are formed on the conducting layer in the first and second trenches.

15 Claims, 34 Drawing Sheets

(56) References Cited

U.S. PATENT DOCUMENTS

| | | |
|---|---|---|
| 7,994,061 B2 | 8/2011 | Jung |
| 8,053,316 B2 | 11/2011 | Kim |
| 8,293,604 B2 | 10/2012 | Yoon |
| 8,420,485 B2 | 4/2013 | Cho |
| 8,440,536 B2 | 5/2013 | Jung |
| 8,497,174 B2 | 7/2013 | Cho |
| 8,643,098 B2 | 2/2014 | Shim |
| 8,878,156 B2 | 11/2014 | Satoh |
| 8,956,961 B2 | 2/2015 | Takesako |
| 9,029,822 B2 | 5/2015 | Satoh |
| 9,136,376 B2 | 9/2015 | Moon |
| 10,361,206 B2 | 7/2019 | Moon |
| 10,811,431 B1 | 10/2020 | Makala |
| 10,892,262 B2 | 1/2021 | Moon |
| 10,943,812 B2 | 3/2021 | Jang |
| 10,950,608 B2 | 3/2021 | Moon |
| 2007/0012996 A1 | 1/2007 | Yoon |
| 2008/0124869 A1 | 5/2008 | Yoon |
| 2009/0004813 A1 | 1/2009 | Lee |
| 2009/0163011 A1 | 6/2009 | Jung |
| 2010/0237405 A1 | 9/2010 | Shin |
| 2010/0285645 A1 | 11/2010 | Yoon |
| 2011/0101447 A1 | 5/2011 | Cho |
| 2011/0143508 A1 | 6/2011 | Kim |
| 2011/0256354 A1 | 10/2011 | Jung |
| 2011/0298046 A1* | 12/2011 | Hong .................. H10B 12/482 438/270 |
| 2012/0025300 A1 | 2/2012 | Chung |
| 2012/0094454 A1 | 4/2012 | Cho |
| 2012/0094455 A1 | 4/2012 | Cho |
| 2012/0135573 A1* | 5/2012 | Kim .................. H10D 64/252 438/270 |
| 2012/0146221 A1* | 6/2012 | Shim .................. H10B 12/485 438/653 |
| 2012/0153365 A1 | 6/2012 | Sung |
| 2013/0049085 A1 | 2/2013 | Lin |
| 2013/0234230 A1* | 9/2013 | Takesako ............. H10D 30/025 438/630 |
| 2013/0234240 A1 | 9/2013 | Moon et al. |
| 2014/0011334 A1* | 1/2014 | Cho .................. H10B 12/482 438/270 |
| 2014/0061850 A1 | 3/2014 | Cho |
| 2014/0138609 A1 | 5/2014 | Satoh et al. |
| 2015/0348976 A1 | 12/2015 | Moon et al. |
| 2019/0252387 A1 | 8/2019 | Moon et al. |
| 2019/0273081 A1 | 9/2019 | Moon et al. |
| 2020/0203215 A1 | 6/2020 | Jang et al. |
| 2022/0199793 A1* | 6/2022 | Kim ...................... H10B 12/05 |

FOREIGN PATENT DOCUMENTS

| | | |
|---|---|---|
| CN | 101847637 A | 9/2010 |
| CN | 102054820 A | 5/2011 |
| CN | 102104005 A | 6/2011 |
| CN | 102820300 A | 12/2012 |
| CN | 103531479 A | 1/2014 |
| CN | 103311249 B | 5/2017 |
| CN | 110896074 A | 3/2020 |
| CN | 110931558 A | 3/2020 |
| CN | 111354728 A | 6/2020 |
| CN | 113179666 A | 7/2021 |

OTHER PUBLICATIONS

International Search Report in the international application No. PCT/CN2021/129356, mailed on Apr. 2, 2022. 6 pages with English translation.

International Search Report in the international application No. PCT/CN2021/129340, mailed on Mar. 4, 2022. 5 pages with English translation.

US Office action in U.S. Appl. No. 17/836,315, mailed on Feb. 20, 2025.

* cited by examiner

SEMICONDUCTOR MEMORY DEVICE AND METHOD FOR MANUFACTURING THE SAME INCLUDING A PLURALITY OF MUTUALLY PERPENDICULAR TRENCHES HAVING THE SAME DEPTH

CROSS-REFERENCE TO RELATED APPLICATIONS

The present application is a continuation of International Application No. PCT/CN2021/129340 filed on Nov. 8, 2021, which claims priority to Chinese Patent Application No. 202110955136.8 filed on Aug. 19, 2021. The disclosures of the above-referenced applications are hereby incorporated by reference in their entirety.

BACKGROUND

With a technological development of chips and memories, requirements for an integration level in a semiconductor manufacturing process are getting higher and higher. In order to improve a utilization rate of a semiconductor substrate and the integration level, a semiconductor device with a vertical channel structure has been gradually applied. Transistor channels with the vertical channel structure are perpendicular to a surface of a substrate, and thus can be conveniently arranged in an array. However, for the semiconductor device with the vertical channel structure, a layout of its wiring and a process need to be further optimized and improved.

SUMMARY

Embodiments of the disclosure relate to the technical field of semiconductors, and relate to, but are not limited to, a semiconductor device and a method for manufacturing the same.

In a first aspect, the embodiments of the disclosure provide a method for manufacturing a semiconductor device. The semiconductor device includes a substrate, and the method includes the following operations.

Multiple first trenches extending in a first direction are formed in the substrate.

Multiple second trenches extending in a second direction are formed in the substrate with the first trenches formed. The first direction is perpendicular to the second direction, and a first depth of a first trench is equal to a second depth of a second trench.

A first insulating layer, a conducting layer and a second insulating layer are formed in sequence in the first trench and the second trench.

The conducting layer in the first trench is separated on a cross section in the second direction to form two bit lines connected to sidewalls at either side of the first trench and extending in the first direction.

Word lines extending in the second direction are formed on the conducting layer in the first trench and the second trench.

In another aspect, the embodiments of the disclosure provide a semiconductor device, including a substrate, multiple first trenches and multiple second trenches, a first insulating layer, a conducting layer and word lines.

The multiple first trenches extend in a first direction and the multiple second trenches extend in a second direction in the substrate. The first direction is perpendicular to the second direction, and a first depth of a first trench is equal to a second depth of a second trench.

The first insulating layer is located at bottoms of the first trench and the second trench.

The conducting layer is located on the first insulating layer. The conducting layer is separated on a cross section in the second direction, and the separated conducting layer constitutes two bit lines connected to sidewalls at either side of the first trench respectively and extending in the first direction.

The word lines extending in the second direction are provided on the conducting layer in the first trench and the second trench.

DETAILED DESCRIPTION

Figure 1:
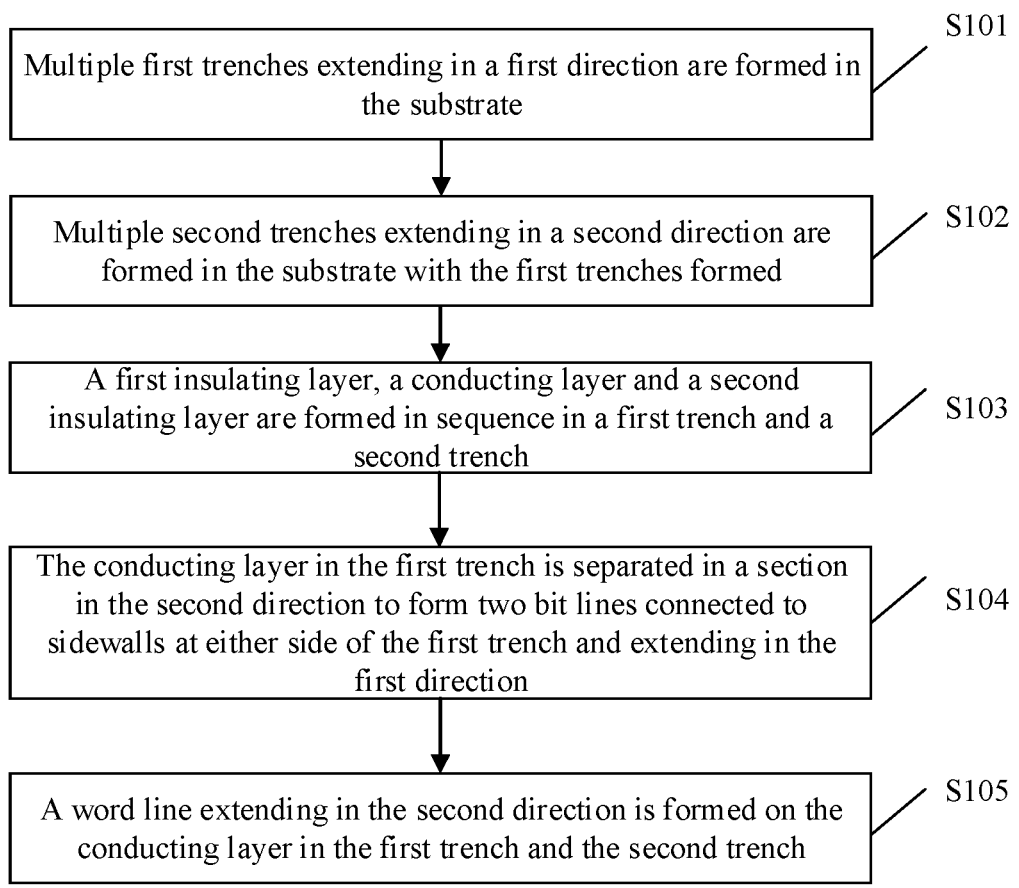
FIG. 1 is a flowchart for achieving a manufacturing method of a semiconductor device provided by embodiments of the disclosure.

In order to facilitate understanding of the disclosure, the disclosure will be described more comprehensively hereinafter with reference to the corresponding drawings. Preferred embodiments of the disclosure are shown in the drawings. However the disclosure may be implemented in many different forms and is not limited to the embodiments described herein. In contrast, these embodiments are provided to make the disclosure of the invention more thorough and comprehensive.

Unless otherwise defined, all technical and scientific terms used herein have the same meaning as commonly understood by one person skilled in the art to which this disclosure belongs. Terms used herein in the specification of the disclosure are only for the purpose of describing specific embodiments and are not intended to limit the disclosure. The term "and/or" as used herein includes any and all combinations of one or more related listed items.

As shown in FIG. 1, the embodiments of the disclosure provide a method for manufacturing a semiconductor device. The semiconductor device includes a substrate, and the method includes the following operation.

At S101, multiple first trenches extending in a first direction are formed in the substrate.

At S102, multiple second trenches extending in a second direction are formed in the substrate with the first trenches formed. The first direction is perpendicular to the second direction, and a first depth of a first trench is equal to a second depth of a second trench.

At S103, a first insulating layer, a conducting layer and a second insulating layer are formed in sequence in the first trench and the second trench.

At S104, the conducting layer in the first trench is separated on a cross section in the second direction to form two bit lines connected to sidewalls of either side of the first trench and extending in the first direction.

At S105, a word line extending in the second direction is formed on the conducting layer in the first trench and the second trench.

In the embodiments of the disclosure, trenches having a pattern can be formed in a surface of the substrate by an etching process. Here, the first direction is a direction extending parallel to the surface of the substrate, the multiple first trenches may be formed in the direction, and these first trenches are parallel to each other. Exemplarily, the multiple first trenches are parallel to each other, and may have a same spacing, depth and width. Therefore, the first trenches may be formed synchronously by etching. Of course, the above etching may be one-time etching or multiple etching.

Figure 2A:
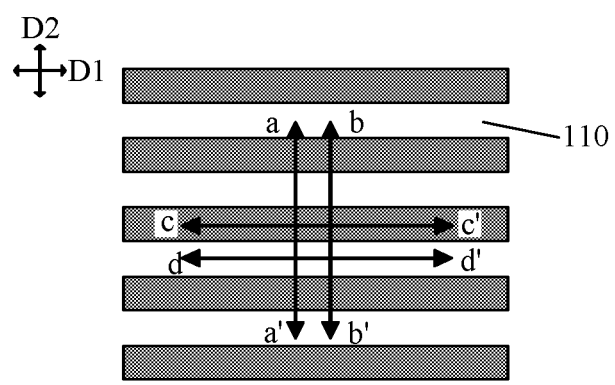
FIG. 2A is a top view of forming first trenches in a manufacturing method provided by embodiments of the disclosure.
Figure 2B:
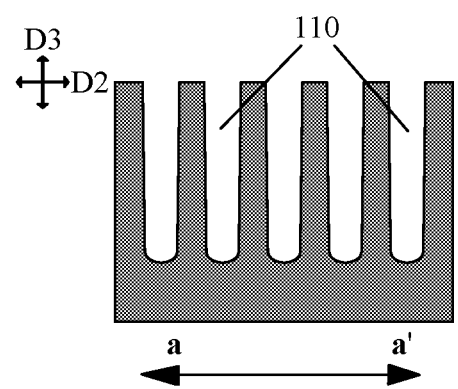
FIG. 2B is a first cross-sectional diagram of forming first trenches in a manufacturing method provided by embodiments of the disclosure.
Figure 2C:
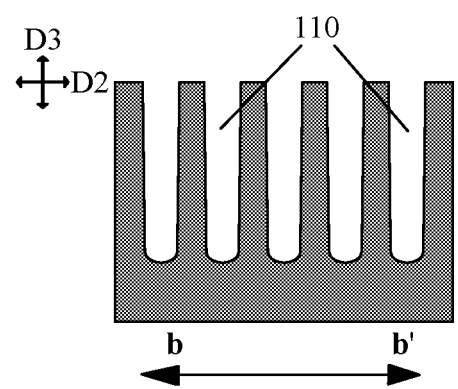
FIG. 2C is a second cross-sectional diagram of forming first trenches in a manufacturing method provided by embodiments of the disclosure.
Figure 2D:
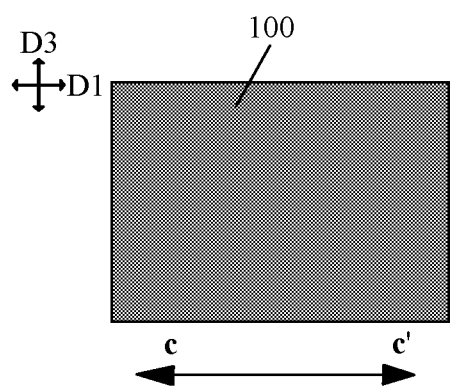
FIG. 2D is a third cross-sectional diagram of forming first trenches in a manufacturing method provided by embodiments of the disclosure.
Figure 2E:
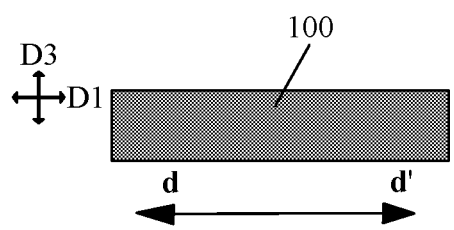
FIG. 2E is a fourth cross-sectional diagram of forming first trenches in a manufacturing method provided by embodiments of the disclosure.

As shown in FIG. 2A, which is a top view after the first trenches are formed. FIG. 2B, FIG. 2C, FIG. 2D and FIG. 2E are cross-sectional diagrams along aa' cross section, bb' cross section, cc' cross section and dd' cross section of FIG. 2A, respectively, and multiple first trenches 110 distributed in parallel are formed in a substrate 100.

After the first trenches are formed, second trenches distributed perpendicular to the first trenches may be formed by utilizing an etching process again. An extending direction of the second trenches is also parallel to the surface of the substrate, but is perpendicular to the first direction. In this way, a network structure, that is, the multiple first trenches and second trenches interlaced with each other can be formed in the surface of the substrate. The unetched regions form semiconductor columns perpendicular one by one to the surface of the substrate. These semiconductor columns can be used as vertical channels of transistors, and then a transistor array can be formed.

Figure 3A:
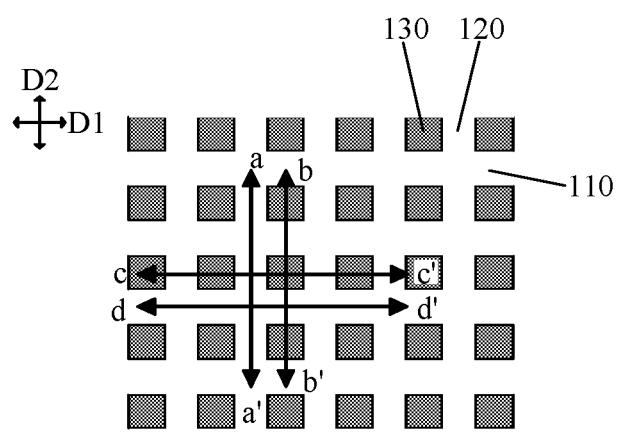
FIG. 3A is a top view of forming second trenches in a manufacturing method provided by embodiments of the disclosure.
Figure 3B:
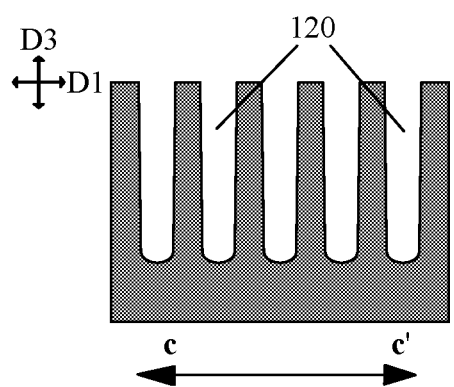
FIG. 3B is a cross-sectional diagram of part of a cross section of forming second trenches in a manufacturing method provided by embodiments of the disclosure.

As shown in FIG. 3A, which is top view after second trenches 120 are formed. FIG. 3B is a cross-sectional diagram along cc' cross section of FIG. 3A, and multiple semiconductor columns 130 are formed in a region outside the first trenches and the second trenches.

Figure 4A:
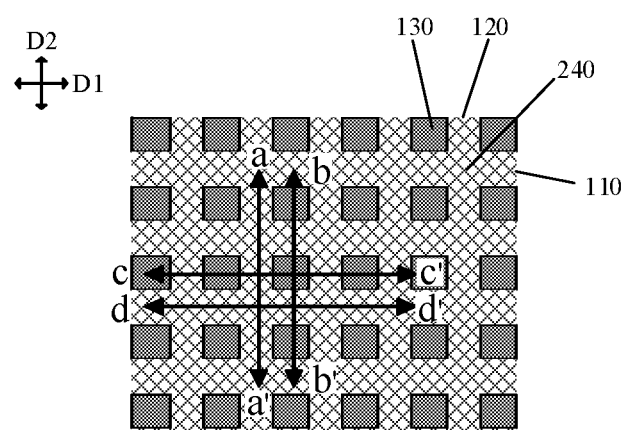
FIG. 4A is a top view of forming a first insulating layer, a conducting layer and a second insulating layer in a manufacturing method provided by embodiments of the disclosure.
Figure 4B:
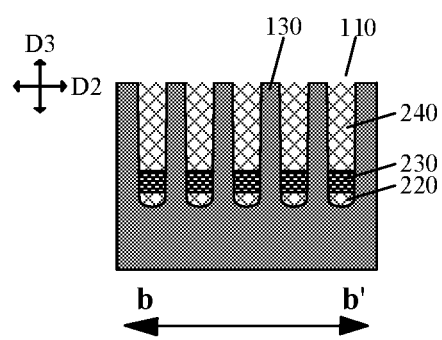
FIG. 4B is a first cross-sectional diagram of part of a cross section of forming a first insulating layer, a conducting layer and a second insulating layer in a manufacturing method provided by embodiments of the disclosure.
Figure 4C:
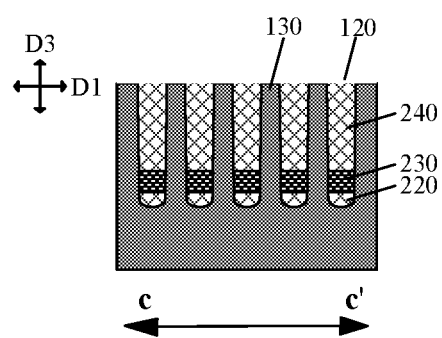
FIG. 4C is a second cross-sectional diagram of part of a cross section of forming a first insulating layer, a conducting layer and a second insulating layer in a manufacturing method provided by embodiments of the disclosure.

In the embodiments of the disclosure, after the first trenches and the second trenches are formed, as shown in FIG. 4A, which is a top view after a first insulating layer 220, a conducting layer 230 and a second insulating layer 240 are formed in sequence in a first trench 110 and a second trench 120. FIG. 4B and FIG. 4C are cross-sectional diagrams along bb' cross section and cc' cross section of FIG. 4A, respectively.

Here, the first insulating layer is a layer covering bottoms of the first trench and the second trench, and is composed of an insulating material, for example, an oxide, a nitride or other insulating materials or the like. The conducting layer is a layer deposited on the first insulating layer, and is composed of a conducting material, for example, metal copper, metal tungsten or other metal materials, a doped semiconductor material, or other conducting materials. The second insulating layer is a layer filled on the conducting layer, and is composed of an insulating material, for example, an oxide, a nitride or other insulating materials or the like. Here, the insulating material constituting the first insulating layer can be the same or different from the insulating material constituting the second insulating layer. The sum of thicknesses of the above-mentioned first insulating layer, conducting layer and second insulating layer is equal to a height of a semiconductor column, that is, the first trench and the second trench are filled up.

The conducting layer in the first trench is continuous and extends in the first direction. The conducting layer connects sidewalls at either side of the first trench along the cross section in the second direction. An isolation structure may be formed in the middle of the conducting layer to realize separating the conducting layer on the cross section in the second direction, for example, by forming a narrow gap and filling an insulating material. In this way, the conducting layer in the first trench extends along the sidewall at either side of the first trench, forming two bit lines. The two bit lines are parallel to each other, and are separated on the cross section in the second direction. Two bit lines are formed on an insulating layer in each of the first trenches Thus, a double bit line structure of the semiconductor device is formed.

Since the isolation structure in the first trench does not extend into the second trench, a word line may be formed on the conducting layer of the above-mentioned first trench and in the second trench. In fact, the word line extends along the second trench, that is, in the second direction. However, because some of a material constituting the word line may be located in the first trench, it is needed to form the word line in the first trench and the second trench. Of course, two adjacent word lines can be isolated by an insulating material.

In this way, for a semiconductor device with a vertical channel, the embodiments of the disclosure provide a way of forming buried bit lines and word lines in the substrate, and there is a double bit line structure for a channel of each transistor, that is, there is the conducting layer formed by depositing a conducting material at either side. In this way, on the one hand, compared to a bit line formed by doping on a semiconductor substrate, a bit line formed by depositing the conducting material in the embodiments of the disclosure has a higher conductivity, so that an overall performance of a semiconductor device can be improved. On the other hand, by forming the double bit line structure, two bit lines of which are parallel to each other and are separated in the second direction, in a first gap between the sidewalls at either side of the first trench, integration level of a semiconductor device can be improved, and a parasitic capacitance between bit lines can be reduced.

In some embodiments, the separating the conducting layer in the first trench on a cross section in the second direction includes the following operations.

In the first direction, a first gap having a third depth is formed in the first insulating layer, the conducting layer and the second insulating layer in the first trench. The third depth is less than a total thickness of the first insulating layer, the conducting layer and the second insulating layer, and the third depth is greater than the sum of thicknesses of the first insulating layer and the conducting layer.

A first insulating material is filled in the first gap to form a first isolation layer. The conducting layer in the first trench is separated by the first isolation layer on the cross section in the second direction.

Figure 5A:
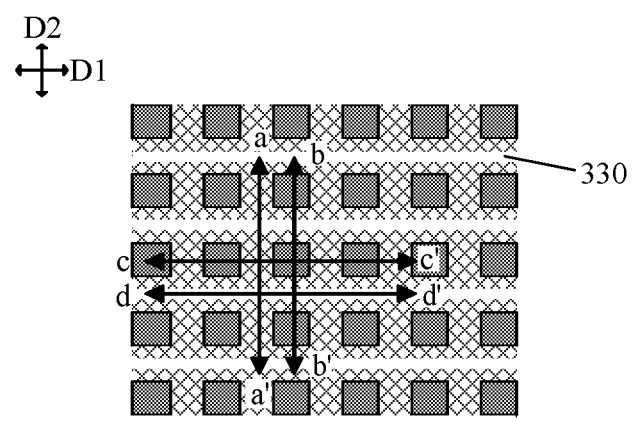
FIG. 5A is a top view of forming a first gap in a manufacturing method provided by embodiments of the disclosure.
Figure 5B:
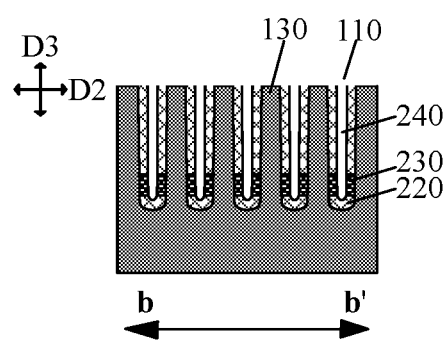
FIG. 5B is a first cross-sectional diagram of part of a cross section of forming a first gap in a manufacturing method provided by embodiments of the disclosure.
Figure 5C:
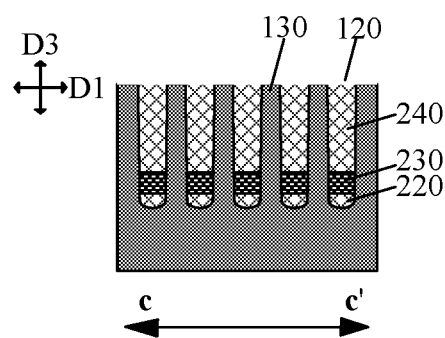
FIG. 5C are a second cross-sectional diagram of part of a cross section of forming a first gap in a manufacturing method provided by embodiments of the disclosure.
Figure 6A:
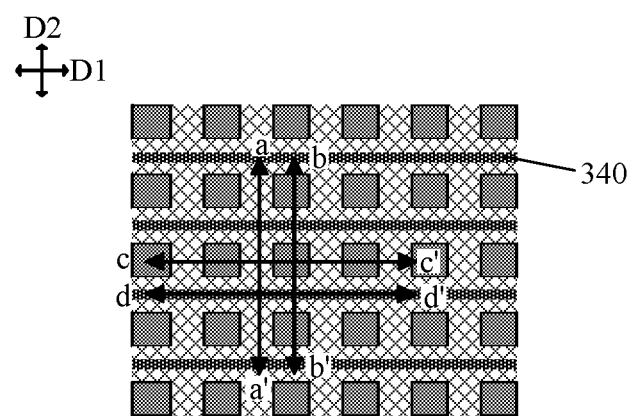
FIG. 6A is a top view of forming a first isolation layer in a manufacturing method provided by embodiments of the disclosure.
Figure 6B:
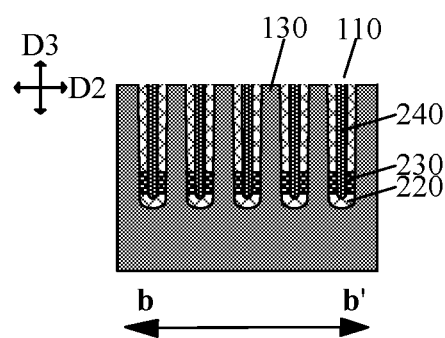
FIG. 6B is a first cross-sectional diagram of part of a cross section of forming a first isolation layer in a manufacturing method provided by embodiments of the disclosure.
Figure 6C:
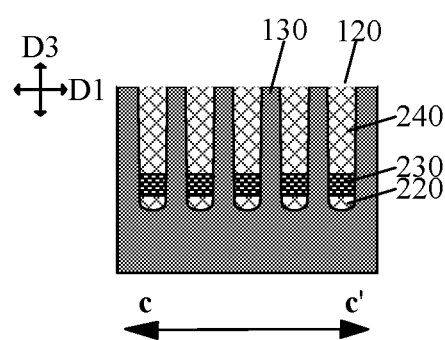
FIG. 6C are a second cross-sectional diagram of part of a cross section of forming a first isolation layer in a manufacturing method provided by embodiments of the disclosure.

As shown in FIG. 5A, which is a top view after a first gap 330 is formed. FIG. 5B and FIG. 5C are cross-sectional diagrams along bb' cross section and cc' cross section of FIG. 5A, respectively. FIG. 6A is a top view after a first isolation layer 340 is formed. FIG. 6B and FIG. 6C are cross-sectional diagrams along bb' cross section and cc' cross section of FIG. 6A, respectively.

In the embodiments of the disclosure, the above-mentioned first gap may be formed in the first insulating layer, the conducting layer, the second insulating layer in first trench by etching. Here, the depth of first gap is greater than the sum of the thicknesses of first insulating layer and the conducting layer, so that the conducting layer can be separate by the first gap on the cross section in the second direction. Exemplarily, a first gap in each first trench may have a same spacing, depth and width. Therefore, the first gaps may be formed synchronously by etching.

After the first gap is formed, a layer of first insulating material may be filled in the first gap by an epitaxial growth process, or a deposition process or the like. For example, the above mentioned first isolation layer may be formed by a chemical vapor deposition (CVD) process, an atomic layer deposition (ALD) process, a physical vapor deposition (PVD) process or the like. Here, the first insulating material may be an oxide, a nitride or other insulating materials or the like. The first insulating material may be filled on an entire inner wall of the first gap, including a bottom and sidewalls of the first gap. In this way, the conducting layer in the first trench is separated by the first insulating material, i.e. the first isolation layer on the cross section in the second direction.

The processes of forming the first isolation layers in the embodiments of the disclosure can be carried out synchronously, which can reduce process operations and thus improve manufacturing efficiency.

In some embodiments, the first insulating material includes an oxide.

Since the oxide can have good insulation and low cost, it can be used as the first insulating material in the embodiments of the disclosure. Exemplarily, the first insulating material may include silicon oxide, nitric oxide, or other oxides or the like.

In some embodiments, after a first insulating layer, a conducting layer and a second insulating layer are formed in sequence in the first trench and the second trench, the method further includes the following operation.

The second insulating layer and a surface of the substrate are flattened to expose a surface of a region of the substrate outside the first trench and the second trench.

In the embodiments of the disclosure, after the second insulating layer is formed by filling the insulating material in first trench and the second trench, some excess insulating material may covers a semiconductor column, thereby affecting the performance of a semiconductor device. Therefore, flattening can be carried out by chemical mechanical polishing (CMP).

In some embodiments, the forming a word line extending in the second direction on the conducting layer in the first trench and the second trench includes the following operations.

Part of the second insulating layer on the conducting layer in the first trench and the second trench is removed to form a depressed region.

The word line is formed in the depressed region.

In the embodiments of the disclosure, part of the second insulating layer may be removed by an etching process to form a depressed region having a pattern. As shown in FIGS. 7A to 7D, which are the corresponding schematic diagrams along aa' cross section, bb' cross section, cc' cross section and dd' cross section of FIG. 6A after forming the depressed region, respectively.

The depressed region has a network structure composed with the first groove and the second groove, and its depth is smaller than the thickness of the second insulating layer. Therefore, a bottom of the depressed region exposes part of second insulating layer, and the sidewalls of the depressed region exposes part of sidewalls of a semiconductor column. Here, the depressed region is separated from the above-mentioned bit line by the second insulating layer. A word line may be formed by depositing in the depressed region, so the bit line and the word line can also be separated by the second insulating layer.

In the embodiments of the disclosure, the bit lines buried in the substrate is formed first, and then the word line is formed, which can reduce a size of a semiconductor device and thus improve integration level.

In some embodiments, the forming the word line in the depressed region includes the following operation.

Gate oxide layers are formed on sidewalls of the depressed region.

Gate conducting layers are formed between the gate oxide layers in the depressed region.

A gate conducting layer in the depressed region is separated into two word lines extending in the second direction on a cross section in the first direction.

Figure 7A:
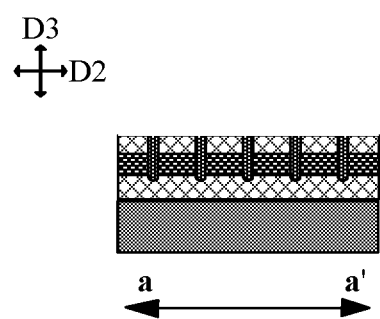
FIG. 7A is a first cross-sectional diagram of forming a depressed region in a manufacturing method provided by embodiments of the disclosure.
Figure 7B:
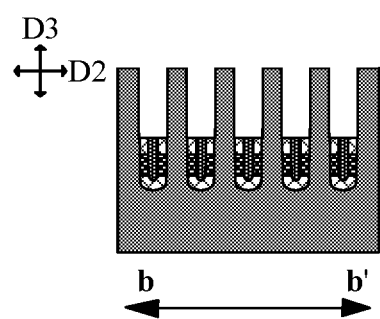
FIG. 7B is a second cross-sectional diagram of forming a depressed region in a manufacturing method provided by embodiments of the disclosure.
Figure 7C:
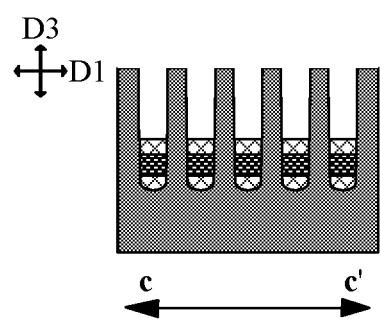
FIG. 7C is a third cross-sectional diagram of forming a depressed region in a manufacturing method provided by embodiments of the disclosure.
Figure 7D:
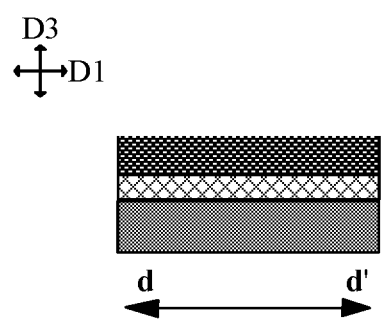
FIG. 7D is a fourth cross-sectional diagram of forming a depressed region in a manufacturing method provided by embodiments of the disclosure.
Figure 8A:
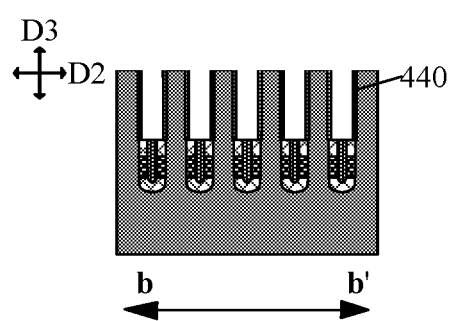
FIG. 8A is a first cross-sectional diagram of part of a cross section of forming gate oxide layers and gate conducting layers in a manufacturing method provided by embodiments of the disclosure.
Figure 8B:
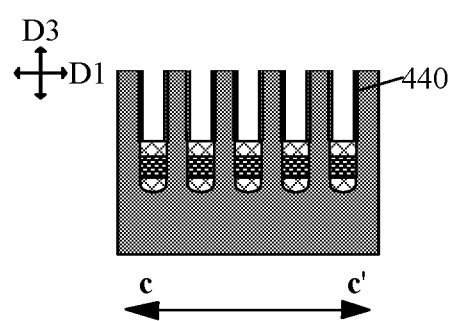
FIG. 8B is a second cross-sectional diagram of part of a cross section of forming gate oxide layers and gate conducting layers in a manufacturing method provided by embodiments of the disclosure.
Figure 8C:
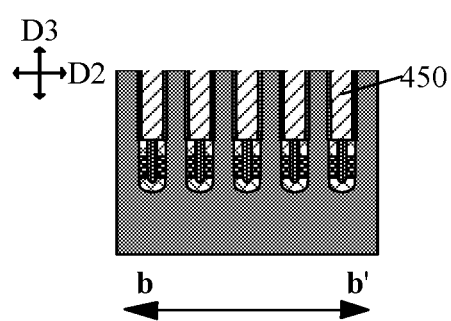
FIG. 8C is a third cross-sectional diagram of part of a cross section of forming gate oxide layers and gate conducting layers in a manufacturing method provided by embodiments of the disclosure.
Figure 8D:
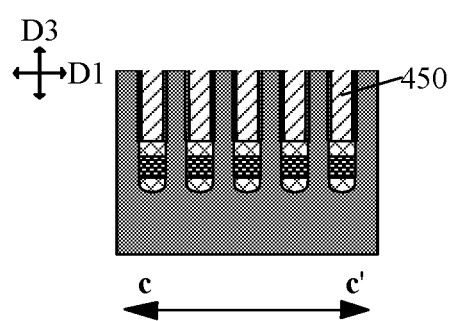
FIG. 8D is a fourth cross-sectional diagram of part of a cross section of forming gate oxide layers and gate conducting layers in a manufacturing method provided by embodiments of the disclosure.

As shown in FIGS. 8A to 8D, FIG. 8A and FIG. 8B are schematic diagrams after forming gate oxide layers 440 on the basis of FIG. 7B and FIG. 7C, respectively; and FIG. 8C and FIG. 8D are schematic diagrams after forming conducting layer 450 based on FIG. 8A and FIG. 8B, respectively.

In the embodiments of the disclosure, part of a sidewall a semiconductor column is exposed in the depressed region. It should be noted that each sidewall of the depressed region is in contact with a corresponding semiconductor column. Therefore, the sidewalls of the semiconductor columns are the sidewalls of the depressed region. Sidewalls of the semiconductor columns may be oxidized to form gate oxide layers at the sidewalls of the depressed region. A gate oxide layer is a part of a gate and is used for electrical isolating a semiconductor column, i.e. a conductive channel. Exemplarily, a height of the gate oxide layer is the same as a depth of the depressed region, and a thickness of the gate oxide layer is less than a width of the depressed region. Therefore, the gate oxide layers of the semiconductor columns in the depressed region are separated from each other, and a bottom of the remaining depressed region still exposes part of the second insulating layer.

A conducting material may be deposited in the remaining depressed region to form a gate conducting layers. The gate conducting layer is located between the gate oxide layers and connects the semiconductor columns in the depressed region. Here, the gate conducting layer and the above-mentioned gate oxide layer surrounding each semiconductor column constitute the gate of a corresponding semiconductor column. A process for depositing the conducting material may be a CVD process, an ALD process, a PVD process or the like.

In the embodiments of the disclosure, the above-mentioned gate conducting layer is continuous in the depressed region, and the double bit line structure extending in the first direction has been formed in the first trench, then a word line structure extending in the second direction can be formed in the second trench. Accordingly, the gate conducting layer connects the gate oxide layers at either side of the depressed region in the second trench on the cross section in the first direction, and an isolation structure may be formed in the middle of the gate conducting layer to realize separating the gate conducting layer on the cross section in the first direction, for example, by forming a narrow gap and filling an insulating material. In this way, the separated gate conducting layer in the second trench and the corresponding gate conducting layer in the first trench form a word line extending in the second direction, connecting a plurality of semiconductor columns in the second direction and corresponding gate oxide layers.

In some embodiments, the forming gate conducting layers between the gate oxide layers in the depressed region includes the following operation.

A conducting material is deposited between the gate oxide layers in the depressed region to form the gate conducting layers. A thickness of a gate conducting layer is less than or equal to a height of a gate oxide layer.

In the embodiments of the disclosure, the deposited conducting material may be a metal material, a doped semiconductor material, or other conducting materials. It is to be noted that the depth of the depressed region is equal to a height of the exposed part of the semiconductor columns, and the height of the gate oxide layer is equal to the depth of the depressed region. Therefore, when the thickness of the gate conducting layer is less than the height of the gate oxide layer, a bottom of the remaining part of the depressed region is in contact with the gate conducting layer, and the sidewalls of the same is in contact with part of the gate oxide layer. When the thickness of the gate conducting layer is equal to the height of the gate oxide layer, the depressed region is filled up.

In some embodiments, the separating the gate conducting layer in the depressed region into two word lines extending in the second direction on a cross section in the first direction includes the following operations.

In the second direction, a second gap having a fourth depth is formed in the gate conducting layer. The fourth depth is greater than or equal to the thickness of the gate conducting layer, and the gate conducting layer is separated by the second gap on the cross section in the first direction.

A second insulating material is filled in the second gap to form a second isolation layer. The gate conducting layers connected by the conducting material at either side of the second isolation layer constitute the word lines.

Figure 9A:
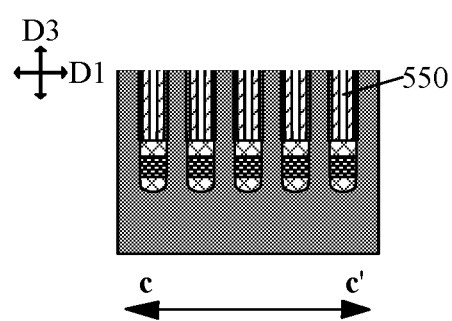
FIG. 9A is a cross-sectional diagram of part of a cross section of forming a second gap in a manufacturing method provided by embodiments of the disclosure.
Figure 9B:
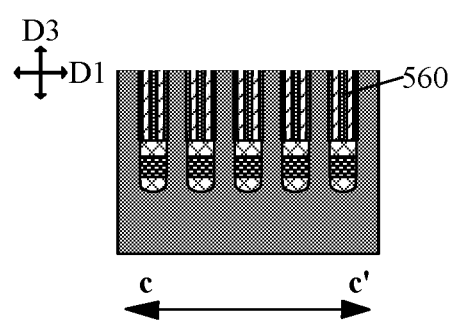
FIG. 9B is a cross-sectional diagram of part of a cross section of forming a second isolation layer in a manufacturing method provided by embodiments of the disclosure.

In the embodiments of the disclosure, a second gap may be formed in the gate conducting layer in the second trench by etching. As shown in FIG. 9A, which is a schematic diagram after forming a second gap 550 on the basis of FIG. 8D. FIG. 9B is a schematic diagram after forming a second isolation layer 560 on the basis of FIG. 9A. Since the second gap is formed in the second trench, a cross-sectional diagram of FIG. 8C is not changed.

A depth of the second gap is greater than or equal to the thickness of the gate conducting layer, so that the gate conducting layer can be separated by the second gap on the cross section in the first direction. Exemplarily, second gaps in the second trenches may have a same spacing, depth and width. Therefore, these second gaps may be formed simultaneously by etching.

After forming the second gap, a second insulating material may be filled in the second gap by a depositing process, for example, a CVD process, an ALD process, a PVD process or the like. Here, the second insulating material may be an oxide, a nitride or other insulating materials or the like. In this way, the conducting layer in the second trench is separated by the second insulating material, i.e. the second isolation layer on the cross section in the first direction.

It should be noted that after forming the second isolation layer, the second isolation layer is in contact with the first isolation layer in each area where a first trench intersects with a second trench.

In some embodiments, the second insulating material includes a nitride.

Since the nitride can have good insulation and low cost, it can be used as the second insulating material in the embodiments of the disclosure. Exemplarily, the second insulating material may include silicon nitride, titanium nitride, or other nitrides or the like.

In some embodiments, the thickness of the gate conducting layer is less than the height of the gate oxide layer. After the gate conducting layer in the depressed region is separated on a cross section in the first direction, the method further includes the following operation.

A third insulating material is filled between the gate oxide layers in the depressed region to form a third isolation layer. A bottom of the third isolation layer is connected to a top of the second isolation layer and the gate conducting layer.

In the embodiments of the disclosure, when the thickness of the gate conducting layer is less than the height of the gate oxide layers, the bottom of the remaining part of the depressed region is in contact with the gate conducting layer, and the sidewalls of the same is in contact with part of a gate oxide layer. The third insulating material can be filled between the gate oxide layers by depositing. The third insulating material here may be an oxide, a nitride or other insulating materials or the like. Exemplarily, the third insulating material may be the same as or different from the second insulating material, and deposition processes may be performed synchronously to form the third isolation layer.

Figure 10A:
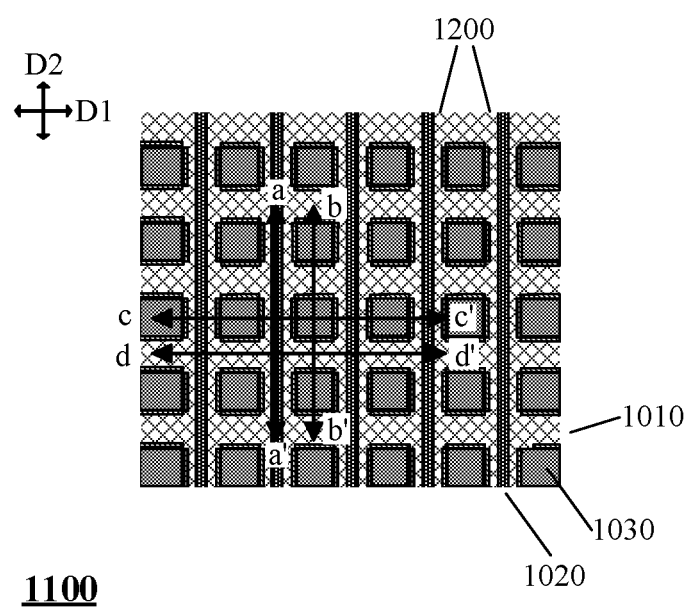
FIG. 10A is a first schematic structural diagram of a semiconductor device provided by embodiments of the disclosure.
Figure 10B:
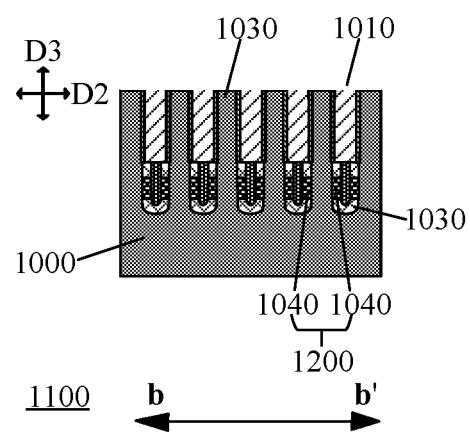
FIG. 10B is a second schematic structural diagram of a semiconductor device provided by embodiments of the disclosure.
Figure 10C:
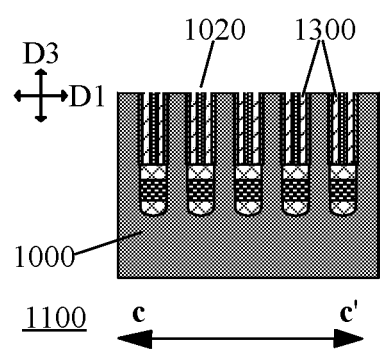
FIG. 10C is a third schematic structural diagram of a semiconductor device provided by embodiments of the disclosure.

Embodiments of the disclosure also provides a semiconductor device, as shown in FIG. 10A, which is top view of a semiconductor device 1100. FIG. 10B and FIG. 10C are cross-sectional diagrams along bb' cross section and cross section of FIG. 10A, respectively. The semiconductor device 1100 includes a substrate 1000, multiple first trenches 1010, multiple second trenches 1020, a first insulating layer 1030, a conducting layer 1040 and a word line 1300.

The multiple first trenches 1010 extend in a first direction D1 and the multiple second trenches 1020 extend in a second direction D2 in the substrate 1000. The first direction D1 is perpendicular to the second direction D2. A first depth of a first trench 1010 is equal to a second depth of a second trench 1020.

The first insulating layer 1030 is located at bottoms of the first trench 1010 and the second trench 1020.

The conducting layer 1040 is located on the first insulating layer 1030, and is separated on a cross section in the second direction D2. The separated conducting layer 1040 constitutes two bit lines 1200 connected to sidewalls at either side of the first trench 1010 respectively and extending in the first direction D1.

The word line 1300 extending in the second direction D2 is provided on the conducting layer 1040 in the first trench 1010 and the second trench 1020.

The first direction in embodiments of the disclosure is a direction extending parallel to a surface of substrate. There are the multiple first trenches parallel to each other in the first direction, and each first trench is a strip structure and extends in the first direction. Exemplarily, the multiple first trenches are parallel to each other, and may have a same spacing, depth and width.

Accordingly, there are the multiple second trenches parallel each other in the second direction perpendicular to the first direction. Each second trench is a strip structure and extends in the second direction. Exemplarily, the multiple second trenches are parallel to each other, and may have a same spacing, depth and width. Here, the second trenches have a same depth as that of the above-mentioned first trenches. In this way, the second trenches and the above-mentioned first trenches form a network structure in the surface of substrate.

The first insulating layer is used for isolating electrically the conducting layer from the substrate, and consists of an insulating material, for example, an oxide, a nitride or other insulating materials or the like. The conducting layer here is composed of a conducting material, for example, metal copper, metal tungsten or other metal materials, a doped semiconductor material, or other conducting materials. The conducting layer in the second trench is directly connected to sidewalls at either side of the second trench, and extends in the second direction. The conducting layer in the first trench is separated into two bit lines on a cross section in the second direction, which are parallel to each other and connected to the sidewalls at either side of the second trench respectively, and extend in the first direction. In this way, a double bit line structure of the embodiments of the disclosure is constituted.

The word line of the embodiments of the disclosure is located above the double bit line structure, and the electrical isolation can be realized between them by an insulating material. Accordingly, the above-mentioned word line extends in the second direction.

Figure 10D:
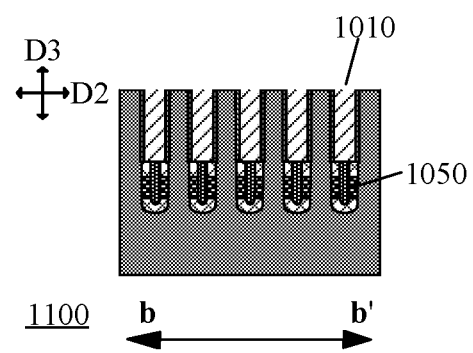
FIG. 10D is a fourth schematic structural diagram of a semiconductor device provided by embodiments of the disclosure.

In some embodiments, as shown in FIG. 10D, which is a cross-sectional diagram along bb' cross section of FIG. 10A, the semiconductor device 1100 further includes a first isolation layer 1050.

The first isolation layer 1050 is located on the first insulating layer in the first trench. The conducting layer in the first trench is separated by the first isolation layer 1050.

In embodiments of the disclosure, the conducting layer in the first trench can be separated into two bit lines parallel to each other by the first isolation layer on the cross section in the second direction. The first isolation layer can be composed of an oxide material and extends in the first direction.

Figure 10E:
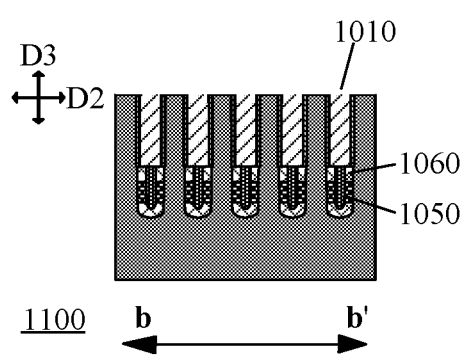
FIG. 10E is a fifth schematic structural diagram of a semiconductor device provided by embodiments of the disclosure.

In some embodiments, as shown in FIG. 10E, which is a cross-sectional diagram in bb' cross section of FIG. 10A, the semiconductor device 1100 further includes a second isolation layer 1060.

The second insulating layer 1060 is located between the conducting layer and the word line. The second insulating layer 1060 in the first trench is separated by the first isolation layer 1050 on the cross section in the second direction.

In the embodiments of the disclosure, an electrical isolation can be realized between the conducting layer and the word line by the second insulating layer. The second insulating layer may be composed of an oxide, a nitride or other insulating materials. The double bit line structure is formed in the first trench, and the two bit lines are separated by the first isolation layer. Accordingly, the second insulating layer in the first trench can also be separated by the first isolation layer.

Figure 10F:
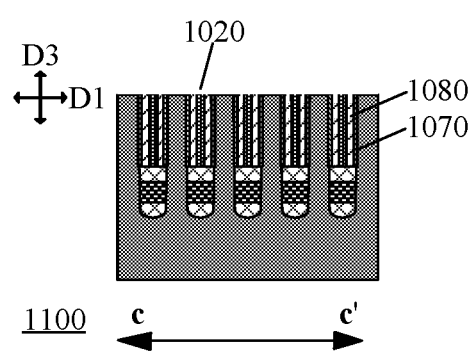
FIG. 10F is a sixth schematic structural diagram of a semiconductor device provided by embodiments of the disclosure.

In some embodiments, as shown in FIG. 10F, which is a cross-sectional diagram along cc' cross section of FIG. 10A, the semiconductor device 1100 further includes gate oxide layers 1070.

The gate oxide layers are located on part of a sidewall of the first trench and the second trench above the second insulating layer.

The word line includes gate conducting layers 1080 corresponding to a semiconductor column located between adjacent gate oxide layers 1070, and the gate conducting layers are connected in the second direction.

In the embodiments of the disclosure, a gate includes a gate oxide layer and a gate conducting layer, and the gate is located on the second insulating layer. The gate oxide layers cover the sidewalls of remaining part of the first trench and second trench, and the gate conducting layer is located between the gate oxide layers. The gate conducting layers in the second trench are connected with each other, and are separated on the cross section in the first direction to constitute the word line extending in the second direction.

Figure 10G:
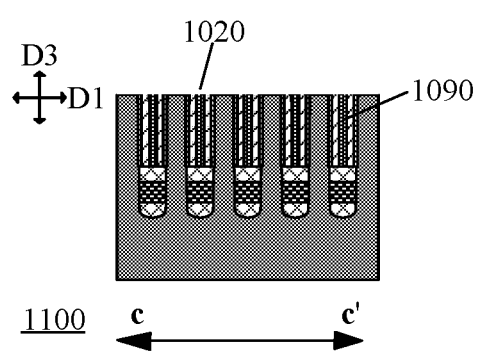
FIG. 10G is a seventh schematic structural diagram of a semiconductor device provided by embodiments of the disclosure.

In some embodiments, as shown in FIG. 10G, which is a cross-sectional diagram along cc' cross section of FIG. 10A, the semiconductor device 1100 further includes a second isolation layer 1090.

The second isolation layer 1090 is located on the second insulating layer in the second trench. The gate conducting layer in the second trench is separated by the second isolation layer 1090 on the cross section in the first direction.

In embodiments of the disclosure, the gate conducting layers in the second trench can be separated into two word lines parallel to each other by the second isolation layer on the cross section in the first direction. The second isolation layer may be composed of a nitride material and extends in the second direction. Here, the material constituting the second isolation layer may be the same as the material constituting the above-mentioned second insulating layer.

The features disclosed in several method or device embodiments provided by the disclosure may be arbitrarily combined without conflict to obtain new method or device embodiments.

The above are only specific implementations of the disclosure, but the scope of protection of the disclosure is not limited to this. Changes or replacements that can be easily conceived of by any person skilled in the art shall be covered by the scope of protection of the disclosure. Therefore, the protection scope of the disclosure shall be subject to the scope of protection of the claims.

According to a technical solution provided by the embodiments of the disclosure, in a manufacturing process of the semiconductor device, by forming the trenches in the substrate, and forming the first insulating layer, the conducting layer and the second insulating layer in the trenches, and then separating the conducting layer in the first trench on the cross section in the second direction, a bit line structure buried in the substrate is formed. In this way, on the one hand, compared to a bit line formed by doping on a semiconductor substrate, a bit line formed by depositing a conducting material in the embodiments of the disclosure has a higher conductivity, so that an overall performance of a semiconductor device can be improved. On the other hand, by forming a double bit line structure, two bit lines of which are parallel to each other and are separated in the second direction, on the sidewalls at either side of the first trench, an integration level of the semiconductor device can be improved, and a parasitic capacitance between bit lines can be reduced.

What is claimed is:

1. A method for manufacturing a semiconductor device, the semiconductor device comprising a substrate, and the method comprising:
    forming multiple first trenches extending in a first direction in the substrate;
    forming multiple second trenches extending in a second direction in the substrate with the first trenches formed, wherein the first direction is perpendicular to the second direction, and a first depth of the first trench is equal to a second depth of the second trench;
    forming a first insulating layer, a conducting layer and a second insulating layer in sequence in the first trench and the second trench;
    separating the conducting layer in the first trench on a cross section in the second direction to form two bit lines connected to sidewalls at either side of the first trench and extending in the first direction; and
    forming word lines extending in the second direction on the conducting layer in the first trench and the second trench.

2. The method of claim 1, wherein the separating the conducting layer in the first trench on a cross section in the second direction comprises:
    in the first direction, forming a first gap having a third depth in the first insulating layer, the conducting layer and the second insulating layer in the first trench, wherein the third depth is less than a total thickness of the first insulating layer, the conducting layer and the second insulating layer, and the third depth is greater than a sum of thicknesses of the first insulating layer and the conducting layer; and
    filling a first insulating material in the first gap to form a first isolation layer, wherein the conducting layer in the first trench is separated by the first isolation layer on the cross section in the second direction.

3. The method of claim 2, wherein the first insulating material comprises an oxide.

4. The method of claim 1, further comprising: after forming the first insulating layer, the conducting layer and the second insulating layer in sequence in the first trench and the second trench,
    flattening the second insulating layer and a surface of the substrate to expose a surface of a region of the substrate outside the first trench and the second trench.

5. The method of claim 1, wherein the forming the word lines extending in the second direction on the conducting layer in the first trench and the second trench comprises:
    removing part of the second insulating layer on the conducting layer in the first trench and the second trench to form a depressed region; and
    forming the word lines in the depressed region.

6. The method of claim 5, wherein the forming the word lines in the depressed region comprises:
    forming gate oxide layers on sidewalls of the depressed region;
    forming a gate conducting layer between the gate oxide layers in the depressed region; and
    separating the gate conducting layer in the depressed region into two word lines extending in the second direction on a cross section in the first direction.

7. The method of claim 6, wherein the forming the gate conducting layer between the gate oxide layers in the depressed region comprises:

depositing a conducting material between the gate oxide layers in the depressed region to form the gate conducting layer, wherein a thickness of the gate conducting layer is less than or equal to a height of the gate oxide layer.

8. The method of claim 6, wherein the separating the gate conducting layer in the depressed region into two word lines extending in the second direction on the cross section in the first direction comprises:

in the second direction, forming a second gap having a fourth depth in the gate conducting layer, wherein the fourth depth is greater than or equal to a thickness of the gate conducting layer, and the second gap separates the gate conducting layer on the cross section in the first direction; and filling a second insulating material in the second gap to form a second isolation layer, wherein the gate conducting layer formed by a conducting material at either side of the second isolation layer constitutes the word lines.

9. The method of claim 8, wherein the second insulating material comprises a nitride.

10. The method of claim 9, wherein the thickness of the gate conducting layer is less than a height of the gate oxide layer, and the method further comprises: after the separating the gate conducting layer in the depressed region on the cross section in the first direction, filling a third insulating material between the gate oxide layers in the depressed region to form a third isolation layer, wherein a bottom of the third isolation layer is connected to a top of the second isolation layer and the gate conducting layer.

11. A semiconductor device, comprising:

a substrate;

multiple first trenches extending in a first direction and multiple second trenches extending in a second direction in the substrate; wherein the first direction is perpendicular to the second direction, and a first depth of the first trench is equal to a second depth of the second trench;

a first insulating layer located at bottoms of the first trench and the second trench;

a conducting layer located on the first insulating layer, wherein the conducting layer is separated on a cross section in the second direction, and the conducting layer separated constitutes two bit lines connected to sidewalls at either side of the first trench respectively and extending in the first direction; and wherein word lines extending in the second direction are provided on the conducting layer in the first trench and the second trench.

12. The semiconductor device of claim 11, further comprising:

a first isolation layer located on the first insulating layer in the first trench, wherein the conducting layer in the first trench is separated by the first isolation layer on the cross section in the second direction.

13. The semiconductor device of claim 12, further comprising:

a second insulating layer located between the conducting layer and the word lines, wherein the second insulating layer in the first trench is separated by the first isolation layer on the cross section in the second direction.

14. The semiconductor device of claim 13, further comprising:

gate oxide layers on part of a sidewall of the first trench and the second trench above the second insulating layer; and the word lines comprising gate conducting layers corresponding to a semiconductor column located between adjacent gate oxide layers, wherein the gate conducting layers are connected in the second direction.

15. The semiconductor device of claim 14, further comprising:

a second isolation layer located on the second insulating layer in the second trench, wherein the gate conducting layer in the second trench is separated by the second isolation layer on a cross section in the first direction.

* * * * *